United States Patent
Kondo et al.

(10) Patent No.: US 7,165,321 B2
(45) Date of Patent: Jan. 23, 2007

(54) METHOD FOR MANUFACTURING PRINTED WIRING BOARD WITH EMBEDDED ELECTRIC DEVICE

(75) Inventors: Koji Kondo, Toyohashi (JP); Tomohiro Yokochi, Kariya (JP); Toshihiro Miyake, Inuyama (JP); Satoshi Takeuchi, Nagoya (JP)

(73) Assignee: Denso Corporation, Kariya (JP)

( * ) Notice: Subject to any disclaimer, the term of this patent is extended or adjusted under 35 U.S.C. 154(b) by 199 days.

(21) Appl. No.: 10/701,441

(22) Filed: Nov. 6, 2003

(65) Prior Publication Data

US 2004/0091687 A1    May 13, 2004

Related U.S. Application Data

(62) Division of application No. 10/166,731, filed on Jun. 12, 2002, now Pat. No. 6,680,441.

(30) Foreign Application Priority Data

| Jun. 13, 2001 | (JP) | ............................. 2001-179118 |
| Jun. 29, 2001 | (JP) | ............................. 2001-199392 |
| Jul. 4, 2001 | (JP) | ............................. 2001-204023 |
| Mar. 7, 2002 | (JP) | ............................... 2002-62394 |

(51) Int. Cl.
*H05K 3/30* (2006.01)

(52) U.S. Cl. ............................ 29/832; 29/833; 29/834; 29/842; 29/852; 174/260; 174/264; 428/209; 361/760

(58) Field of Classification Search .......... 29/830–834, 29/840–852; 174/252, 260, 258, 264; 428/209; 361/780, 794; 257/737, 735, 777–780
See application file for complete search history.

(56) References Cited

U.S. PATENT DOCUMENTS 4,737,395 A * 4/1988 Mabuchi et al. ............ 428/138

(Continued)

FOREIGN PATENT DOCUMENTS

JP    A-2-150098    6/1990

(Continued)

OTHER PUBLICATIONS

Notice of Rejection issued from Japanese Patent Office issued on Jan. 24, 2006 for the corresponding Japanese patent application No. 2002-062394 (a copy and English translation thereof).

(Continued)

*Primary Examiner*—Minh Trinh
(74) *Attorney, Agent, or Firm*—Posz Law Group, PLC

(57) ABSTRACT

A manufacturing method of a printed wiring board having an embedded electric device is as follows. A first resin film having an opening or a sheet member having a recess is piled with a plurality of second resin films, on which a plurality of conductive layers is formed. The first and second resin films and the sheet member include thermoplastic resin. An electric device is inserted in the opening or the recess. Then, the piled body including the electric device is pressed and heated to integrate the piled body. When the piled body is pressed and heated, electrodes of the electric device are electrically connected to the conductive layers while the first and second resin films and the sheet member plastically deformed to seal the electric device.

7 Claims, 9 Drawing Sheets

U.S. PATENT DOCUMENTS

| | | | |
|---|---|---|---|
| 4,751,126 A | 6/1988 | Oodaira et al. | |
| 5,018,051 A | 5/1991 | Yamada et al. | |
| 5,161,093 A | 11/1992 | Gorczyca et al. | |
| 5,336,928 A | 8/1994 | Neugebauer et al. | |
| 5,401,688 A | 3/1995 | Yamaji et al. | |
| 5,773,536 A | 6/1998 | Mizoguchi et al. | |
| 5,808,873 A | 9/1998 | Celaya et al. | |
| 5,866,950 A | 2/1999 | Iwasaki et al. | |
| 6,017,971 A | 1/2000 | Mizoguchi et al. | |
| 6,031,723 A | 2/2000 | Wieloch | |
| 6,038,133 A | 3/2000 | Nakatani et al. | |
| 6,051,093 A | 4/2000 | Tsukahara | |
| 6,163,456 A | 12/2000 | Suzuki et al. | |
| 6,180,881 B1 | 1/2001 | Isaak | |
| 6,184,577 B1 | 2/2001 | Takemura et al. | |
| 6,239,496 B1 | 5/2001 | Asada | |
| 6,292,366 B1 | 9/2001 | Platt | |
| 6,338,767 B1 | 1/2002 | Nakatani et al. | |
| 6,359,235 B1 | 3/2002 | Hayashi | |
| 6,404,052 B1 | 6/2002 | Kurita et al. | |
| 6,404,643 B1 | 6/2002 | Chung | |
| 6,449,836 B1 | 9/2002 | Miyake et al. | |
| 6,469,374 B1 | 10/2002 | Imoto | |
| 6,512,182 B1 | 1/2003 | Takeuchi et al. | |
| 6,531,022 B1 | 3/2003 | Tsukahara | |
| 6,555,763 B1 | 4/2003 | Hirasawa et al. | |
| 6,625,880 B1 * | 9/2003 | Nabemoto et al. | 29/830 |
| 6,680,441 B1 * | 1/2004 | Kondo et al. | 174/260 |
| 6,784,375 B1 | 8/2004 | Miyake et al. | |
| 6,955,948 B1 * | 10/2005 | Asahi et al. | 438/125 |
| 6,983,535 B1 * | 1/2006 | Crockett et al. | 29/832 |

FOREIGN PATENT DOCUMENTS

| | | | |
|---|---|---|---|
| JP | A-3-191596 | | 8/1991 |
| JP | A-04-163988 | | 6/1992 |
| JP | A-4-356998 | | 12/1992 |
| JP | A-6-120670 | | 4/1994 |
| JP | A-07-263867 | | 10/1995 |
| JP | A-11-126978 | | 5/1999 |
| JP | A-11-145381 | | 5/1999 |
| JP | 11-233904 | * | 8/1999 |
| JP | A-11-312868 | | 11/1999 |
| JP | A-2000-151112 | | 5/2000 |
| JP | A-2000-223837 | | 8/2000 |
| JP | A-2001-119147 | | 4/2001 |

OTHER PUBLICATIONS

Office Communication issued from European Patent Office issued on Jan. 27, 2006 for the corresponding European patent application No. 02 013 103.3-2214 (a copy and English translation thereof).

Notice of Rejection issued from Japanese Patent Office issued on Jan. 24, 2006 for the corresponding Japanese patent application No. 2001-204023 (a copy and English translation thereof).

Search Report dated Nov. 10, 2006 from European Patent Office for counterpart application of 02 013 103.3-2214.

* cited by examiner

METHOD FOR MANUFACTURING PRINTED WIRING BOARD WITH EMBEDDED ELECTRIC DEVICE

CROSS REFERENCE TO RELATED APPLICATION

This application is a divisional application of U.S. patent application Ser. No. 10/166,731, which was filed on Jun. 12, 2002, now U.S. Pat. No. 6,680,441.

BACKGROUND OF THE INVENTION

The present invention relates to a method for manufacturing a printed wiring board, in which an electric device is embedded in an insulating base member, and to the printed wiring board manufactured by the method.

Conventionally, a printed wiring board, in which an electric device is embedded in an insulating base member for achieving high density packaging of the electric devices, is known.

For example, there is an art disclosed in JP-A-11-312868. In the art, a plurality of first resin films that make up an insulating base member are formed. The first resin films include thermosetting resin in B stage. A plurality of vias are formed in each first resin film. A plurality of conductive layers are formed on a surface of each first resin film. Then, a second resin film is formed. The second resin film has a glass transition temperature higher than the curing temperature of the first resin films. An electric device sealed with resin is mounted on the second resin film. The second resin film is stacked with and pressed with the first resin films to form an integrated body of the first and second resin films. Subsequently, the thermosetting resin included in the first films is cured by heating the integrated body to manufacture a printed wiring board, in which the conductive layers are electrically interconnected by the vias, the electric device is electrically connected to the conductive layers, and the electric device is embedded in the insulating base member.

However, in the art of the publication, there is a difficulty in the alignment of the electric device with the insulating base member, which is formed when the thermosetting resin included in the first films is cured, in the printed wiring board because the second resin film, on which the electric device is mounted, is clamped between and stacked with the first resin films. Therefore, a relatively great deviation in the alignment can cause a defect in electrical contact between the electric device and the vias.

There is another art disclosed in JP-A-4-356998. In the art, a recess is formed by counter boring in an insulating base member of a double-sided board, which makes up an inner layer board of a multilayered board. Then, an electric device is placed in the recess and soldered. Afterward, the double-sided board, on which electric device is soldered, is multi-layered by stacking and pressing pre-pregs on both surface of the double-sided board to manufacture a printed wiring board with the embedded electric device.

However, in the art of JP-A-4-356998, the manufacturing process is complicated and the number of manufacturing steps increases because the pre-pregs are separately piled on the double-sided board.

SUMMARY OF THE INVENTION

The present invention has been made in view of the above aspects with an object to provide a method for manufacturing a printed wiring board having an embedded electric device, with which the electric device is readily aligned with an insulating base member of the printed wiring board and with which the manufacturing process can be simplified, and to provide the printed wiring board manufactured by the method.

The method includes steps of forming an opening in a first resin film made of thermoplastic resin, stacking the first resin film and a plurality of second resin films, which are made of the thermoplastic resin and on which a plurality of conductive layers are formed, inserting an electric device, which has substantially the same size as the opening, in the opening, and bonding the stacked first and second resin films together by pressing and heating. When the stacked first and second resin films are pressed and heated, a plurality of electrodes of the electric device are electrically connected to the conductive layers while the first and second resin films are plastically deformed to seal the electric device.

Alternatively, the method includes steps of forming a recess or an opening in a sheet member made of thermoplastic resin, stacking resin films, which are made of thermoplastic resin and on which a plurality of conductive layers are formed, placing the sheet member on an outer surface of or in a stacked body, which is formed in the step of stacking, of the resin films, inserting an electric device in the recess or the opening, and bonding the resin films and the sheet member by pressing and heating. When the resin films and the sheet member are pressed and heated, a plurality of electrodes of the electric device are electrically connected to the conductive layers while the thermoplastic resin is plastically deformed to seal the electric device.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

First Embodiment

Figure 1A:
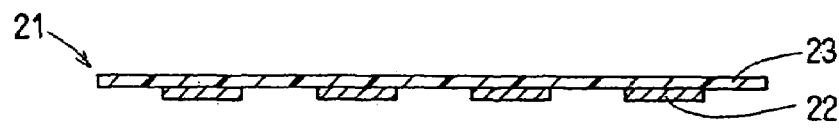
FIGS. 1A to 1G are step-by-step cross-sectional views showing the summarized production process of the printed wiring board according to the first embodiment of the present invention.

As shown in FIG. 1A, a single-sided conductive layer film 21 includes a resin film 23 and a plurality of conductive layers 22. The conductive layers 22 are shaped by etching a copper foil with a thickness of 18 micrometers, which is adhered onto one side of the resin film 23. In FIG. 1A, the resin film 23 is a thermoplastic film with a thickness of 75 micrometers and is made of a mixture of 65–35 weight % polyetheretherketone resin and 35–65 weight % polyetherimide resin.

Figure 1B:
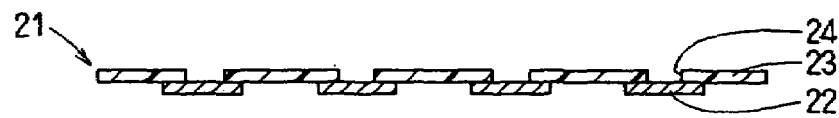

After the conductive layers 22 are formed as shown in FIG. 1A, a plurality of bottomed via-holes 24 are formed in the resin film 23 by irradiating the resin film 23 with carbon dioxide laser, as shown in FIG. 1B. The via-holes 24 are bottomed by the conductive layers 22. When the via-holes 24 are irradiated by carbon dioxide laser, the conductive layers 22 are prevented from being dug by adjusting the power and the exposure time period of the carbon dioxide laser.

Other than the carbon dioxide laser, excimer laser and so on may be used for forming the via-holes 24. Instead of laser, other means such as drilling may be used. However, machining by laser beam is preferred because the machining enables the formation of a via-hole with a relatively fine diameter and because the damage that the conductive layers 22 incur is relatively small.

Figure 1C:
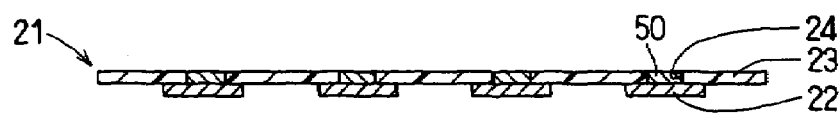

After the via-holes 24 are formed as shown in FIG. 1B, conductive paste 50, which is a material for electrical connection, is packed in the via-holes 24, as shown in FIG. 1C. The conductive paste 50 is prepared as follows. A solution, in which 6 g of ethyl cellulose resin is dissolved in 60 g of terpineol, which is organic solvent, is added to 300 g of tin particles with a mean particle size of 5 micrometers and a specific surface of 0.5 $m^2/g$ and 300 g of silver particles with a mean particle size of 1 micrometer and a specific surface of 1.2 $m^2/g$. The mixture is compounded by a mixer to make it pasty. The ethyl cellulose resin is added to improve the shape-holding ability of the conductive paste 50. As a material for improving the shape-holding ability, acrylic resin may be used.

After the conductive paste 50 is printed and packed in the via-holes 24 of the single-sided conductive layer film 21 by a screen-printing machine using a metal mask, the terpineol is evaporated at 140–160° C. for about 30 minutes. In FIG. 1C, the screen-printing machine is used for packing the conductive paste 50 into the via-holes 24. Other methods using, for example, a dispenser may be used as long as the packing is ensured.

Instead of terpineol, other organic solvents may be used to make the mixture pasty. Desired organic solvents have a boiling point of 150–300° C. Organic solvents having a boiling point of 150° C. or lower are likely to cause a problem that time-dependent variation of the viscosity of the conductive paste 50 becomes relatively large. On the other hand, organic solvents having a boiling point higher than 300° C. have a problem that the evaporation of the solvents takes relatively long time.

The metal particles included in the conductive paste 50 preferably have a mean particle size of 0.5–20 micrometers and a specific surface of 0.1–1.5 $m^2/g$. In the case that the metal particles have a mean particle size smaller than 0.5 micrometers or a specific surface greater than 1.5 $m^2/g$, relatively plenty of organic solvent is required for providing the conductive paste 50 with suitable viscosity for packing the conductive paste 50 into the via-holes 24. The conductive paste 50 that contains relatively plenty of organic solvent requires relatively long time for the evaporation of the solvent. If the evaporation is insufficient, relatively plenty of gas is generated when the conductive paste 50 is heated during an interlayer connecting period, which is described later, and voids tend to be generated in the via-holes 24. Therefore, the reliability of interlayer connection, which is described later, is lowered.

On the other hand, in the case that the metal particles have a mean particle size greater than 20 micrometers or a specific surface smaller than 0.1 $m^2/g$, it becomes difficult to pack the conductive paste 50 into the via-holes 24. In addition, the metal particles tend to be unevenly distributed, so it is difficult to form conductive compounds 51, which is described later, made of homogeneous alloy when the conductive paste 50 is heated. Thus, it becomes difficult to ensure the reliability of the interlayer connection. Before the conductive paste 50 is packed into the via-holes 24, the surfaces of the conductive layers 22, which are located at the bottoms of the via-holes 24, may be lightly etched or chemically reduced to facilitate the connection, which is described later, between the conductive layers 22 and the conductive compounds 51 at the bottoms of the via-holes 24.

Figure 1D:
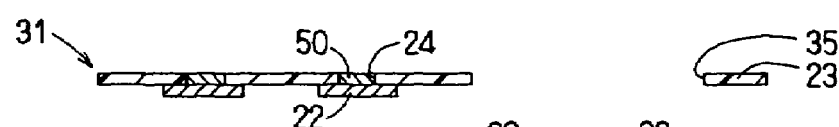

As shown in FIG. 1D, a single-sided conductive layer film 31 includes the resin film 23, the conductive layers 22, and the conductive paste 50, which are packed in the via-holes 24 formed in the resin film 23. The single-sided conductive layer film 31 is formed by the same steps as shown in FIGS. 1A–1C, with which the single-sided conductive layer film 21 is formed. When the via-holes 24 are formed, an opening 35, which has substantially the same size as an electric device 41, which is described later, is formed by laser machining in the single-sided conductive layer film 31 at the position where the electric device 41 is placed to be embedded. The size of the opening 35 is set to give a clearance of 20 micrometers or greater and equal to or smaller than the thickness of the resin film 23 (75 micrometers in FIG. 1D) between the electric device 41 and the resin film 23 around the electric device 41.

The opening 35 in FIG. 1D is formed by the laser machining when the via-holes 24 are formed. However, it is possible to form the opening 35 separately from the via-holes 24 by punching or routing. In FIG. 1D, as well as the resin film 23 of the single-sided conductive layer film 21, a thermoplastic resin film, which has a thickness of 75 micrometers and is made of a mixture of 65–35 weight % polyetheretherketone resin and 35–65 weight% polyetherimide resin, is used as the resin film 23 of the single-sided conductive layer film 31.

Figure 1E:
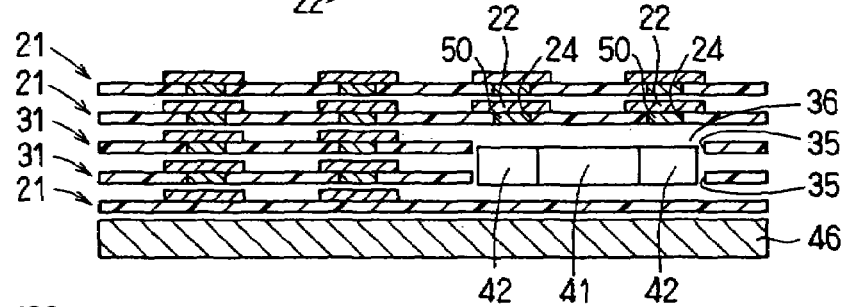

After the opening 35 is formed in the single-sided conductive layer film 31 and the conductive paste 50 is packed and evaporated in the via-holes 24, a plurality of single-sided conductive layer films 21, 31 are stacked, as shown in FIG. 1E. In FIG. 1E, the numbers of single-sided conductive layer films 21, 31 are three and two, respectively. When being stacked, the single-sided conductive layer films 21, 31 are stacked such that each side having the conductive layers 22 faces upward as viewed in FIG. 1E. That is, the single-sided conductive layer films 21, 31 are stacked such that each surface that has the conductive layers 22 and each surface that does not have face each other.

The single-sided conductive layer films 31, which have the opening 35 at the same position, are stacked such that the dimension of a space 36, which is formed by a plurality of openings 35 (two openings in FIG. 1E), in the vertical direction of FIG. 1E is substantially equal to or smaller than the thickness of the electric device 41. The thickness of the electric device 41 is 160 micrometers in FIG. 1E, so the single-sided conductive layer films 31 are stacked such that the dimension of the space 36 is substantially equal to or smaller than 160 micrometers, that is, such that two openings 35 respectively having a dimension of 75 micrometers in the vertical direction of FIG. 1E are combined to provide the space 36 with a dimension of 150 micrometers.

When the single-sided conductive layer films 21, 31 are stacked, the electric device 41, which is a chip component such as a resistor, a condenser, a filter, or an 1C, is inserted in the space 36. As shown in FIG. 1E, electrodes 42 are formed at two ends of the electric device 41 on a surface that faces the via-holes 24 of the single-sided conductive layer film 21. The via-holes 24 packed with the conductive paste 50 are located at the position, where the conductive layers 22 and the electrodes 42 can be electrically connected, in the single-sided conductive layer film 21 that is located above the space 36. A heat sink 46, which is a heat releasing member made of aluminum, is piled under the stacked single-sided conductive layer films 21, 31, as shown in FIG. 1E. No via-holes are formed in the resin film 23 that faces the heat sink 46, as viewed in FIG. 1E.

Figure 1F:
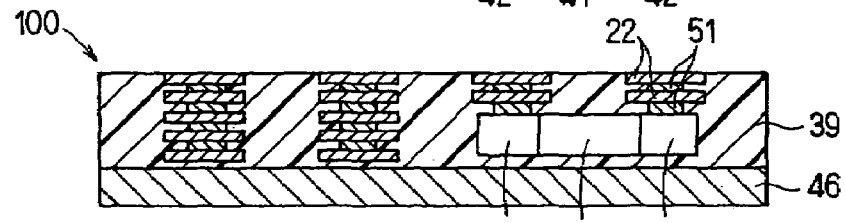

After the single-sided conductive layer films 21, 31 and the heat sink 46 are stacked as shown in FIG. 1E, the stacked body is pressed and heated from the top and the bottom surfaces of the stacked body by a vacuum hot-press machine. Specifically, the stacked body is pressed under 1–10 MPa pressure while being heated at 250 to 350° C. for 10–20 minutes to bond each single-sided conductive layer film 21, 31 and the heat sink 46 together, as shown in FIG. 1F. The resin films 23 are all made of the same thermoplastic resin, so the resin films 23 are readily heat-sealed to make an integrated insulating base member 39.

At the same time, a plurality of pairs of conductive layers 22, which are separated by a resin film 23, are electrically connected by the conductive compounds 51, which are made by sintering and solidifying the conductive paste 50 in the via-holes 24, and the electrodes 42 of the electric device 41 and the conductive layers 22 are also connected to form a multilayer printed wiring board 100, in which the electric device 41 is embedded. The conductive compounds 51 are a material for electrical connection, and each via-hole 24 and each conductive compound 51 make up each via in the multilayer printed wiring board 100.

Each pair of conductive layers 22 is electrically connected by each via on the basis of the same mechanism. The conductive paste 50 packed and evaporated in the via-holes 24 is in the state that tin particles and silver particles are mixed. When the conductive paste 50 is heated at 250–350° C., the tin particles melt, stick to, and cover the surface of the silver particles because the melting point of the tin particles and that of the silver particles are 232° C. and 961° C., respectively.

As the heating is continued in the state that the tin particles and the silver particles are mixed, fused tin begins defusing from the surface of the silver particles and an alloy (melting point 480° C.) is formed between tin and silver. Due to the formation of the alloy, the conductive compounds 51 made of the alloy are formed in the via-holes 24.

When the conductive compounds 51 are formed in the via-holes 24, each conductive compound 51 is pressed to each surface, which is located at each bottom of the via-holes 24, of the conductive layers 22. Therefore, the tin component in the conductive compound 51 and the copper component in the conductive layers 22 diffuse mutually, and a solid phase diffusion layer is formed at each boundary between the conductive compounds 51 and the conductive layers 22.

Each electrode 42 of the electric device 41 is made of a metal such as copper or nickel. The surface of each electrode 42 is plated with tin and so on. On the basis of substantially the same mechanism as in the electrical connection between the conductive compounds 51 and the conductive layers 22, each electrode 42 is electrically connected to one conductive layer 22 by one conductive compound 51, by one solid phase diffusion layer made at one boundary between the conductive compound 51 and the conductive layer 22, and by the other solid phase diffusion layer made at the other boundary between the conductive compound 51 and the electrode 42.

The modulus of elasticity of the resin films 23 is reduced to about 5–40 MPa when the stacked body shown in FIG. 1E is pressed and heated by the vacuum hot-press machine. Therefore, each resin film 23 that is located around the opening 35 is deformed to protrude toward the opening 35. In addition, each resin film 23 that is located on or under the opening 35 in the vertical direction of FIG. 1E is also deformed to protrude toward the opening 35. That is, each resin film 23 that defines the space 36 is protruded toward the space 36.

Therefore, the electric device 41 is sealed by the insulating base member 39, which is formed by integrating and deforming the resin films 23 of the single-sided conductive layer films 21, 31, as shown in FIG. 1F. The modulus of elasticity of the resin films 23 while the resin films 23 are pressed and heated is preferably 1–1000 MPa. If the modulus of elasticity is greater than 1000 MPa, it is difficult to deform the resin films 23 to heat-seal the resin films 23. On the other hand, if the modulus of elasticity is smaller than 1 MPa, the resin films 23 flow too readily to form the printed board 100.

The size of the opening 35 is set to give a clearance of 20 micrometers or greater and equal to or smaller than the thickness of the resin films 23. This is because if the clearance is smaller than 20 micrometers, it is difficult to insert the electric device 41 in the opening 35 and because if the clearance is greater than the thickness of the resin films 23, it is difficult to seal completely the electric device 41 when the resin films 23 are deformed by being pressed and heated.

Figure 2A:
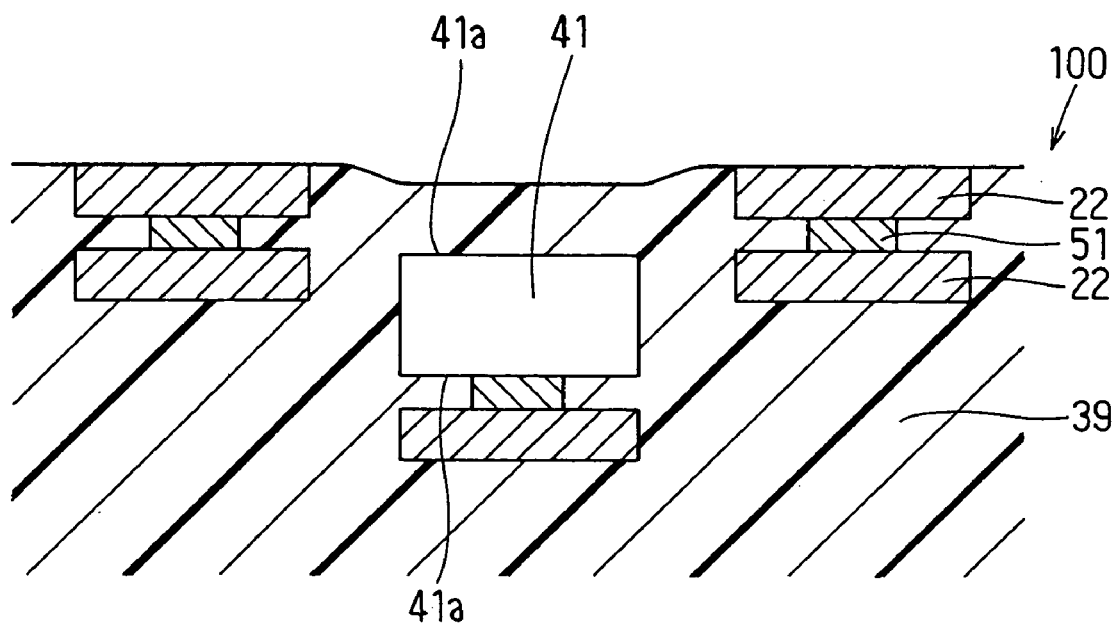
FIG. 2A shows the state of a concave surface not according to the first embodiment.
Figure 3A:
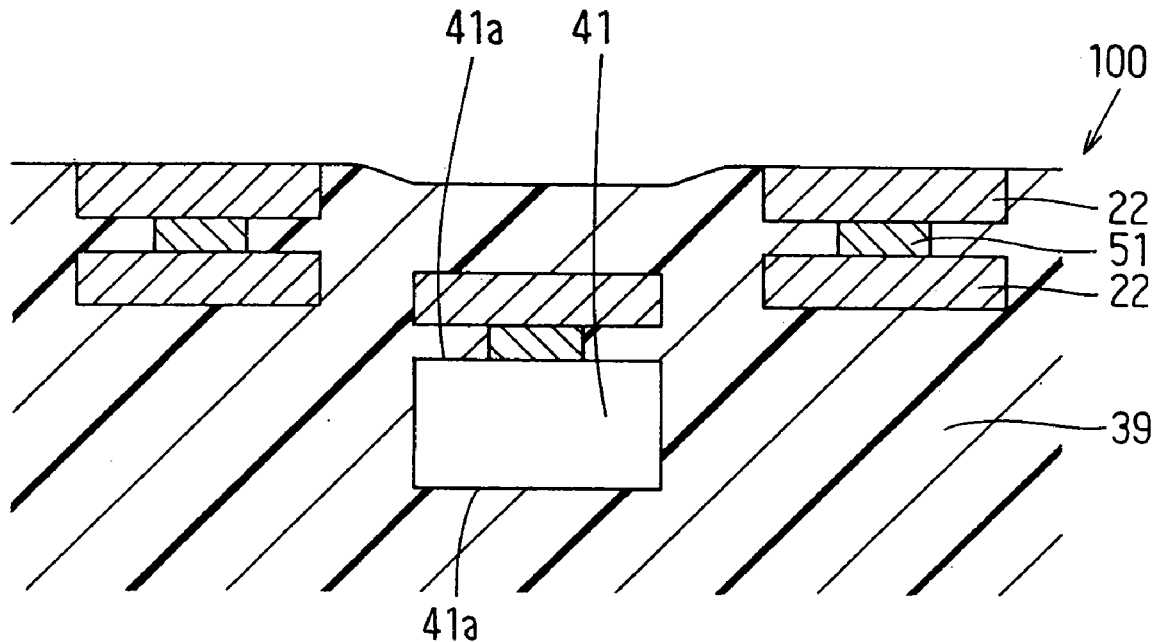
FIG. 3A shows the state of another concave surface not according to the first embodiment.

In FIG. 1E, the number of the stack of the single-sided conductive layer films 31 is determined such that the dimension of the space 36, which incorporates the opening 35, is substantially equal to or smaller than the thickness of the electric device 41 in the vertical direction of FIG. 1E. This is because in the case that the dimension of the space 36 is greater than the thickness of the electric device 41, the insulating base member 39, in which the electric device 41 is sealed and embedded, becomes concave on the surfaces above and below the region where the electric device 41 is embedded, as shown in FIGS. 2A and 3A. If the printed wiring board 100 having the concave surfaces is placed in a high temperature atmosphere, the insulating base member 39 is deformed to level the concave surface. Therefore, a stress that peels the insulating base member 39 is generated at each boundary 41a shown in FIGS. 2A and 3A between the electric device 41 and the insulating base member 39, and the reliability in insulation and sealing is lowered in the printed wiring board 100. However, if the stress that peels the insulating base member 39 is negligible, the dimension of the space 36 may be relatively a little greater than the thickness of the electric device 41.

Figure 2B:
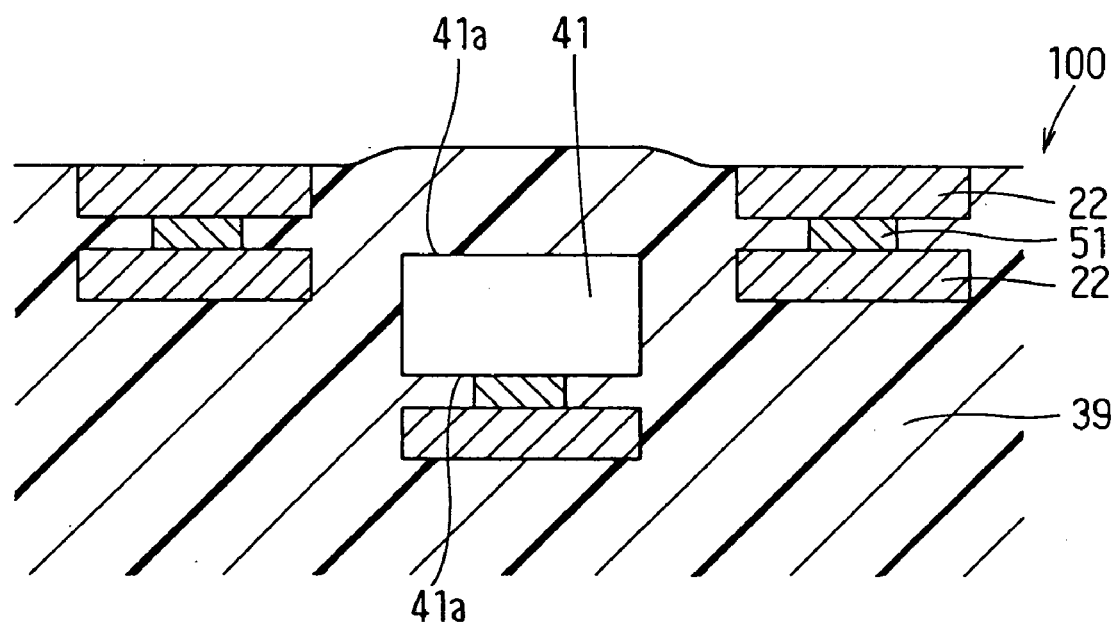
FIG. 2B shows the state of a convex surface according to the first embodiment.
Figure 3B:
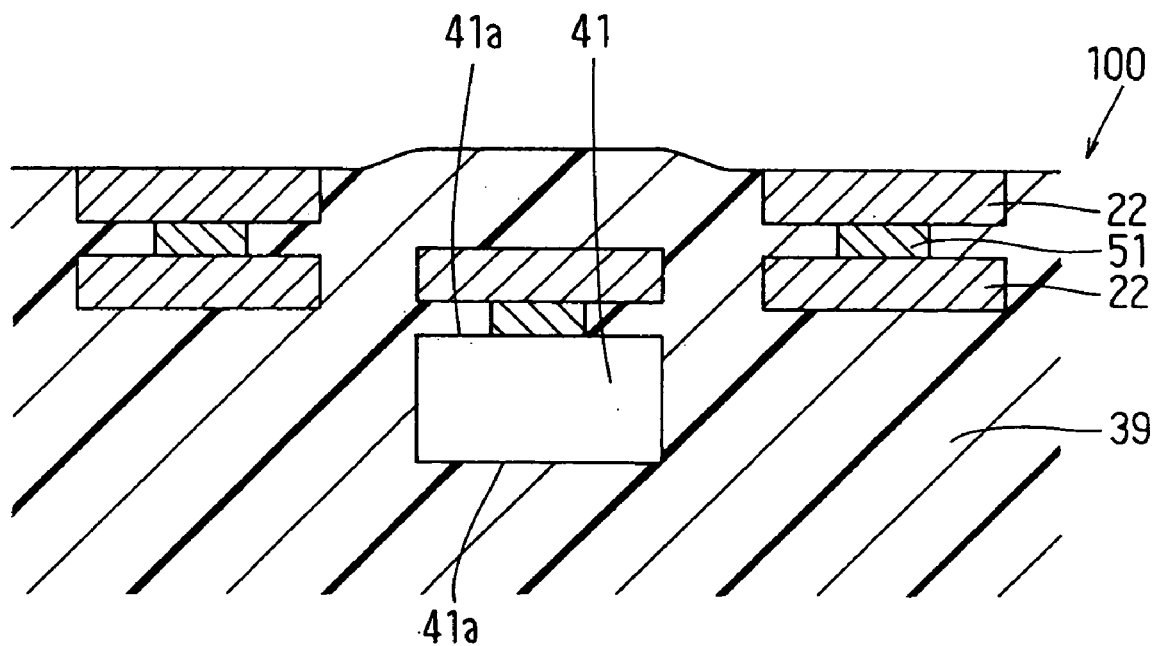
FIG. 3B shows the state of another convex surface according to the first embodiment.

On the other hand, as long as the dimension of the space 36 is substantially equal to or smaller than the thickness of the electric device 41, the surfaces above and below the region where the electric device 41 is embedded are planar or convex, as shown in FIGS. 2B and 3B. As long as the surfaces are planar or convex, even if the printed wiring board 100 is placed in a high temperature atmosphere and the insulating base member 39 is deformed to level the convex surface, a stress that presses the insulating base member 39 to the electric device 41 is generated at the boundaries 41a. However, in the case that the dimension of the space 36 is relatively too smaller than the thickness of the electric device 41, the surfaces of the printed wiring board 100 becomes too convex and there can be a difficulty in assembling an electric device on the convex surface.

Figure 1G:
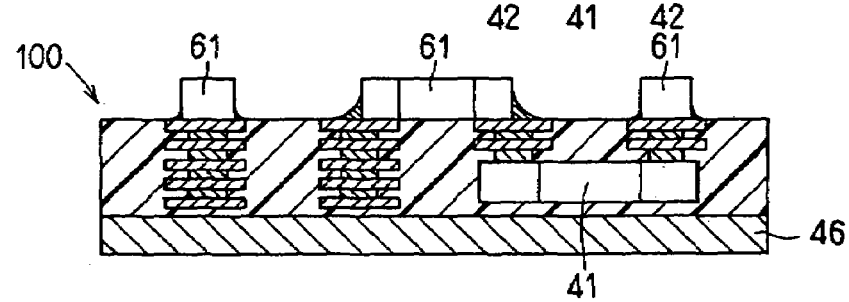

According to the manufacturing method and the structure provided by the manufacturing method described above, the printed wiring board 100, in which the electric device 41 is relatively precisely positioned in the insulating base member 39, relatively surely electrically connected to the conductive layers 22, and relatively surely sealed by the insulating base member 39, is available. The printed wiring board 100 having the heat sink 46 at the lower surface as viewed in FIG. 1G can realize high density packaging and simultaneously have desired heat releasing ability by assembling another electric device 61 on the upper surface and by embedding the electric device 41.

In addition, the integration of the single-sided conductive layer films 21, 31 and the heat sink 46, the electrical connection between each pair of conductive layers 22, and the electrical connection between the electric device 41 and the conductive layers 22 are implemented simultaneously by being pressed and heated the stacked body. Therefore, the number of fabrication steps of the printed wiring board 100 can be reduced and so can the fabrication cost.

Second Embodiment

Figure 4:
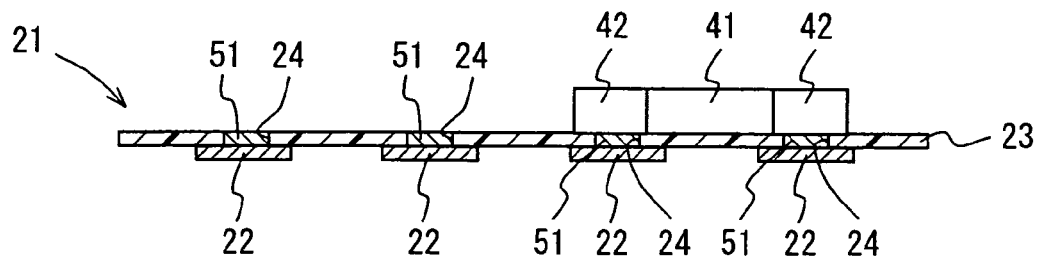
FIG. 4 is a cross-sectional view showing a part of the production process of the printed wiring board according to the second embodiment of the present invention.

As shown in FIG. 4, the method of the second embodiment is deferent from that of the first embodiment in electrically connecting the electric device 41 and the conductive layers 22 of one of the single-sided conductive layer films 21 before the single-sided conductive layer films 21, 31 are stacked. The single-sided conductive layer film 21, to which the electric device 41 is connected, is placed above the space 36 at a stacking step shown in FIG. 5, in the method of the second embodiment Specifically, as shown in FIG. 4, the electric device 41 is placed on the side, where the conductive layers 22 are not located, of one single-sided conductive layer film 21. Then, the single-sided conductive layer film 21 and the electric device 41 are pressed and heated. The via-holes 24 are located at the positions corresponding to the electrodes 42 of the electric device 41. Therefore, when the single-sided conductive layer film 21 and the electric device 41 are pressed and heated, the conductive paste 50 is sintered to make the integrated conductive compounds 51, and the electrodes 42 of the electric device 41 and the conductive layers 22 are electrically connected.

Figure 5:
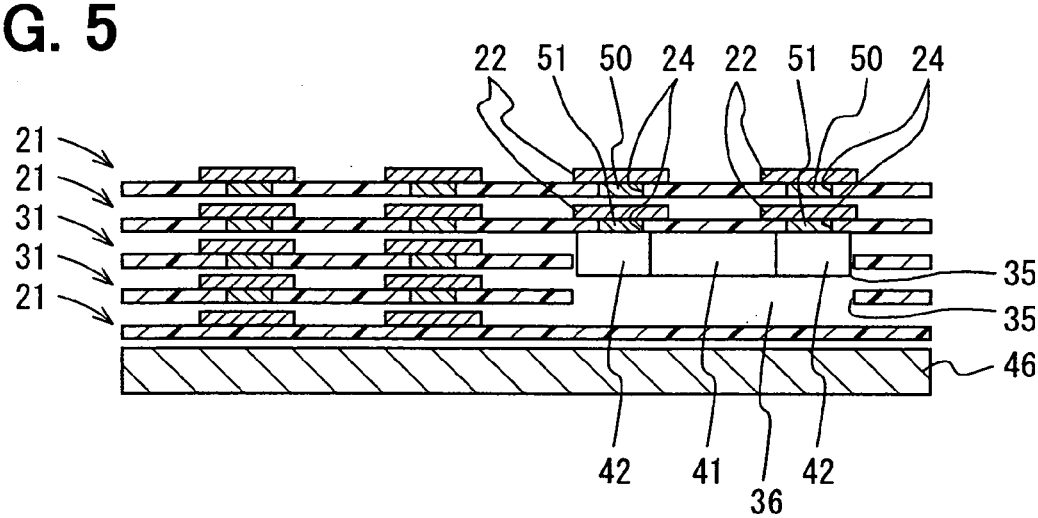
FIG. 5 is another cross-sectional view showing another part of the production process of the printed wiring board according to the second embodiment.
Figure 6:
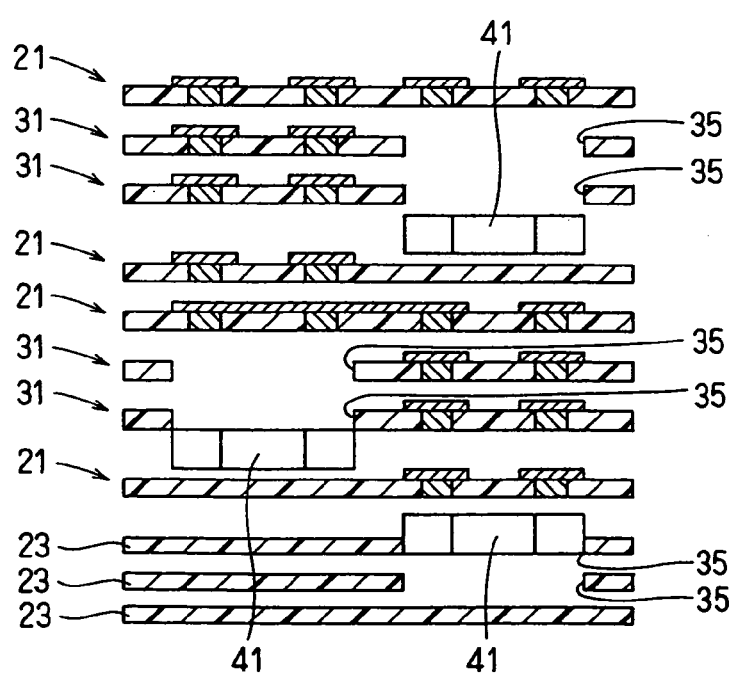
FIG. 6 is a cross-sectional view showing a variation of stacking configuration for the first and second embodiments.
Figure 7:
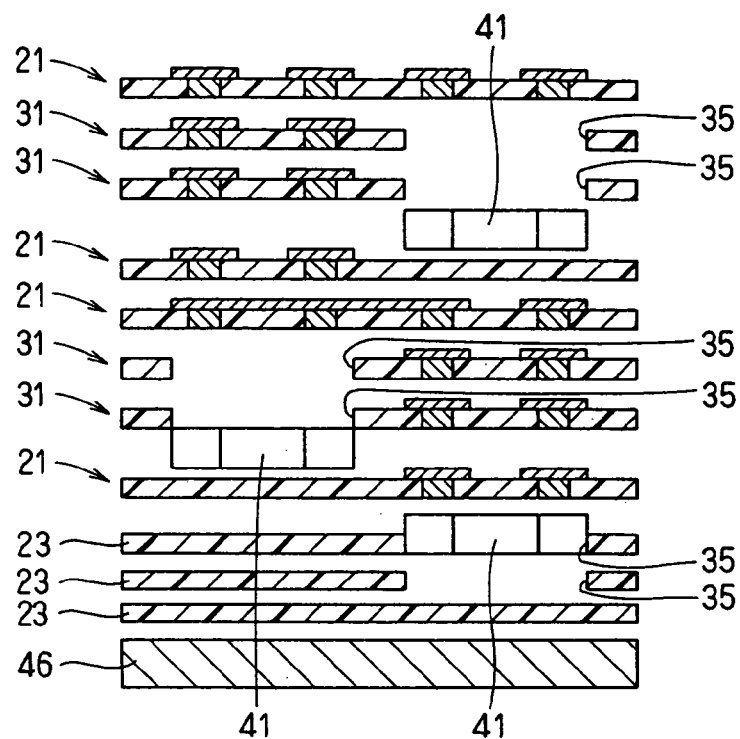
FIG. 7 is a cross-sectional view showing another variation of stacking configuration for the first and second embodiments.

Then, the single-sided conductive layer film 21, to which the electric device 41, other single-sided conductive layer films 21, 31, and the heat sink 46 are stacked, as shown in FIG. 5. Subsequently, the stacked body is pressed and heated by the same method in the first embodiment to form the multilayer printed wiring board 100 shown in FIG. 1F. Although the conductive compounds 51 are already formed in the via-holes 24 of the single-sided conductive layer film 21, to which the electric device 41 is connected, before the stacked body is pressed and heated, the tin component in the conductive compounds 51 and the copper component in the conductive layers 22 diffuse mutually when the stacked body is pressed and heated, and the solid phase diffusion layers are formed at the boundaries between the conductive compounds 51 and the conductive layers 22.

Dimensional relations between the opening 35 and the electric device 41 and between the space 36 and the electric device 41 are the same as in the first embodiment.

By the manufacturing method of the second embodiment, the printed wiring board 100 having the same structure as in the first embodiment is available. According to the second embodiment, the electric device 41 is connected to the conductive layers 22 of the single-sided conductive layer film 21 before all the single-sided conductive layer films 21 are stacked. Therefore, the electric device 41 is readily inspected using the conductive layers 22, which are electrically connected to the electric device 41, of the single-sided conductive layer film 21 even if the electric device 41 is relatively extremely small. In addition, because the electric device 41 can be inspected before being embedded, it is possible to avoid manufacturing a waste inferior printed wiring board 100 even if the electric device 41 is inferior.

Third Embodiment

Figure 14:
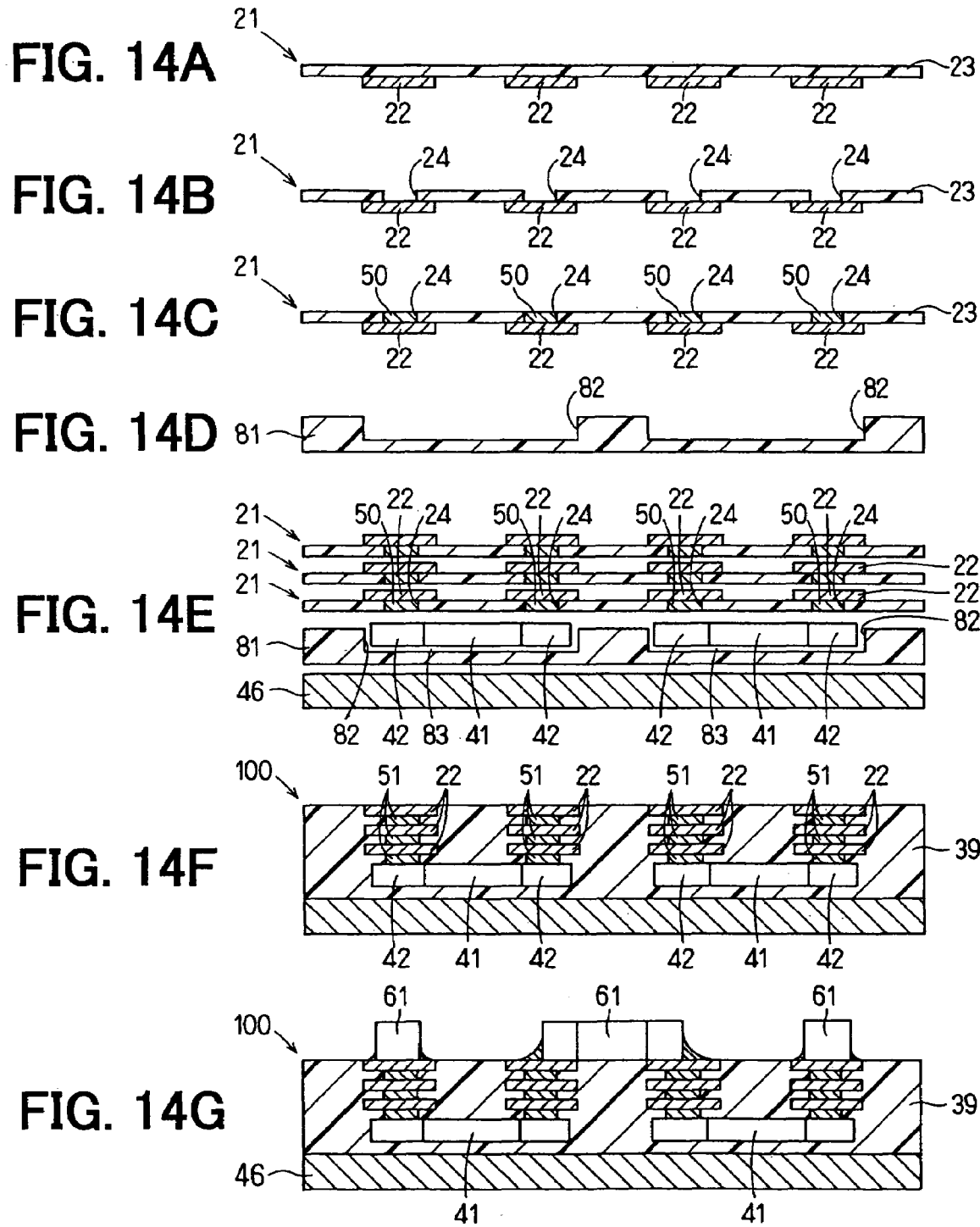
FIGS. 14A to 14G are step-by-step cross-sectional views showing the summarized production process of the printed wiring board according to the third embodiment of the present invention.

The same single-sided conductive layer films 21, which have no opening, as the ones in the above embodiments are formed using steps shown in FIGS. 14A to 14C, which are the same steps as the ones shown in FIGS. 1A to 1C. A sheet member 81 shown in FIG. 14D is made of thermoplastic resin and has a thickness of 1 mm. Specifically, sheet member 81 is made of a mixture of 65–35 weight % polyetheretherketone resin and 35–65 weight % polyetherimide resin. As shown in FIG. 14D, the sheet member 81 has a plurality of recesses 82 (two recesses in FIG. 14D), which have substantially the same size as the electric device 41 and which are formed by hot-press machining at the positions where two electric device 41 are placed. The size of each recess 82 is set to provide a clearance of 20 micrometers or greater and equal to or smaller than the depth of the recess 82 (0.85 mm in FIG. 14D) between each electric device 41 and vertical surfaces defining each recess 82 in FIG. 14D.

The depth of each recess 82 is set to be substantially equal to or smaller than the thickness of the electric device 41 in the vertical direction of FIG. 14D. The thickness of the electric device 41 is 0.9 mm in FIG. 14E, so each recess 82 is formed such that the depth is 0.85 mm. In FIG. 14D, the sheet member 81 is formed by hot-press machining. However, the sheet member 81 may be formed by injection molding and so on.

After the sheet member 81 is formed and the conductive paste 50 is packed and evaporated in the via-holes 24 of the single-sided conductive layer films 21, as shown in FIG. 14E, the single-sided conductive layer films 21 (three films in FIG. 14E) are stacked, and the sheet member 81 is piled under the stacked single-sided conductive layer films 21.

Specifically, the single-sided conductive layer films 21 are stacked such that each side having the conductive layers 22 faces upward as viewed in FIG. 14E, that is, each surface having the conductive layers 22 and each surface having no conductive layers 22 face each other. The sheet member 81 is piled with the stacked single-sided conductive layer films 21 such that the surface of the stacked single-sided conductive layer films 21, on which the conductive layers 22 are not located, and the surface of the sheet member 81, on which the recesses 82 are located, face each other.

When the single-sided conductive layer films 21 and the sheet member 81 are stacked, an electric device 41, which is a chip component such as a resistor, a condenser, a filter, or an IC, is placed in each space 83 defined by each recess 82, as shown in FIG. 14E. The single-sided conductive layer film 21 that is located above the space 83 includes two pairs of via-holes 24 packed with the conductive paste 50. The via-holes 24 are located at the positions where the conductive layers 22 and the electrodes 42 can be electrically connected. Then, as shown in FIG. 14E, the heat sink 46, which is made of aluminum, is piled under the stacked body of the single-sided conductive layer films 21 and the sheet member 21.

Subsequently, the stacked body is pressed and heated from two surfaces of the stacked body by the vacuum hot-press machine to form a multilayer printed wiring board 100. Specifically, the piled body is pressed under 1–10 MPa pressure while being heated at 250–350° C. for 10–20 minutes. After the piled body is pressed, each single-sided conductive layer film 21, the sheet member 81, and the heat sink 46 are bonded together, as shown in FIG. 14F. The resin films 23 and the sheet member 81 are made of the same thermoplastic resin, so they are readily heat-sealed to make the integrated insulating base member 39. At the same time, the conductive layers 22 are electrically interconnected by the conductive compounds 51, and the electrodes 42 of the electric device 41 and the conductive layers 22 are electrically connected in the same manner as in the above embodiments.

The modulus of elasticity of the resin films 23 and the sheet member 81 is reduced to about 5–40 MPa when being pressed and heated by the vacuum hot-press machine. Therefore, the sheet member 81 around the recesses 82 and the resin film 23 above the recesses 82 are deformed to protrude toward the recesses 82. That is, the resin film 23 and the sheet member 81, which surround the spaces 83, are protruded toward the spaces 83.

Therefore, the electric device 41 is sealed by the insulating base member 39, which is made by integrating and deforming the resin films 23 and the sheet member 81. The modulus of elasticity of the resin films 23 and the sheet member 81 while being pressed and heated is preferably 1–1000 MPa. If the modulus of elasticity is greater than 1000 MPa, it is difficult to heat-seal the resin films 23 and the sheet member 81 and difficult to deform the resin films 23 and the sheet member 81. On the other hand, if the modulus of elasticity is smaller than 1 MPa, the resin films 23 and the sheet member 81 flow too readily to form the printed board 100.

The size of each recess 82 is preferably set to provide a clearance of 20 micrometers or greater and equal to or smaller than the depth of the recesses 82 (0.85 mm in FIG. 14D) between each electric device 41 and the vertical surfaces defining each recess 82 in FIG. 14D. This is because if the clearance is smaller than 20 micrometers, it is difficult to insert the electric device 41 in the recesses 82 and because if the clearance is greater than the depth of the recesses 82, it is difficult to seal completely the electric device 41 when the sheet member 81 is deformed by being pressed and heated.

The thickness of the electric device 41 is 0.9 mm, and each recess 82 has a depth of 0.85 mm in FIG. 14E. The depth of each recess 82 is preferably substantially equal to or smaller than the thickness of the electric device 41 in the vertical direction of FIG. 14D. This is because in the case that the depth of each recess 82 is greater than the thickness of the electric device 41, the printed wiring board 100 becomes concave on the surfaces above and below the region where the electric device 41 is embedded, as shown in FIGS. 2A and 3A. If the printed wiring board 100 having the concave surfaces is placed in a high temperature atmosphere, the insulating base member 39 is deformed to level the concave surface. Therefore, a stress that peels the insulating base member 39 is generated at each boundary 41a shown in FIGS. 2A and 3A between the electric device 41 and the insulating base member 39, and the reliability in insulation and sealing is lowered in the printed wiring board 100. However, if the stress that peels the insulating base member 39 is negligible, the depth of the recesses 82 may be relatively a little greater than the thickness of the electric device 41.

On the other hand, as long as the depth of the recesses 82 is substantially equal to or smaller than the thickness of the electric device 41, the surfaces above or below the region where the electric device 41 is embedded are planar or convex, as shown in FIGS. 2B and 3B. As long as the surfaces are planar or convex, even if the printed wiring board 100 is placed in a high temperature atmosphere and the insulating base member 39 is deformed to level the convex surface, a stress that presses the insulating base member 39 to the electric device 41 is generated at the boundaries 41a. However, in the case that the depth of the recesses 82 is relatively too smaller than the thickness of the electric device 41, the surfaces of the printed wiring board 100 become too convex and there can be a difficulty in assembling the electric device on the convex surfaces.

According to the manufacturing method and the structure provided by the manufacturing method of the third embodiment, the stacking and integration of the single-sided conductive layer films 21, the sheet member 81, and the heat sink 46, the electrical interconnection between the conductive layers 22, and the electrical connection of the electric device 41 to the conductive layers 22 are implemented simultaneously by being pressed and heated. Therefore, the fabrication process of the printed wiring board 100 can be simplified, and the number of fabrication steps can be reduced. In addition, even in the case that a large electric device needs to be embedded, a sheet member 81 having a size corresponding to that of the large electric device can be molded and used, so the number of fabrication steps can be reduced more than when the insulating base member 39 is formed using only the resin film 23

According to the manufacturing method and the structure provided by the manufacturing method of the third embodiment, the printed wiring board 100, in which the electric device 41 is relatively precisely positioned in the insulating base member 39, relatively surely electrically connected to the conductive layers 22, and relatively surely sealed in the insulating base member 39, is available. The printed wiring board 100 having the heat sink 46 at the lower surface as viewed in FIG. 14G can realize high density packaging and have desired heat transmission by assembling an electric device 61 on the upper surface of the printed wiring board 100 and by embedding the electric device 41.

Modifications

Figure 8:
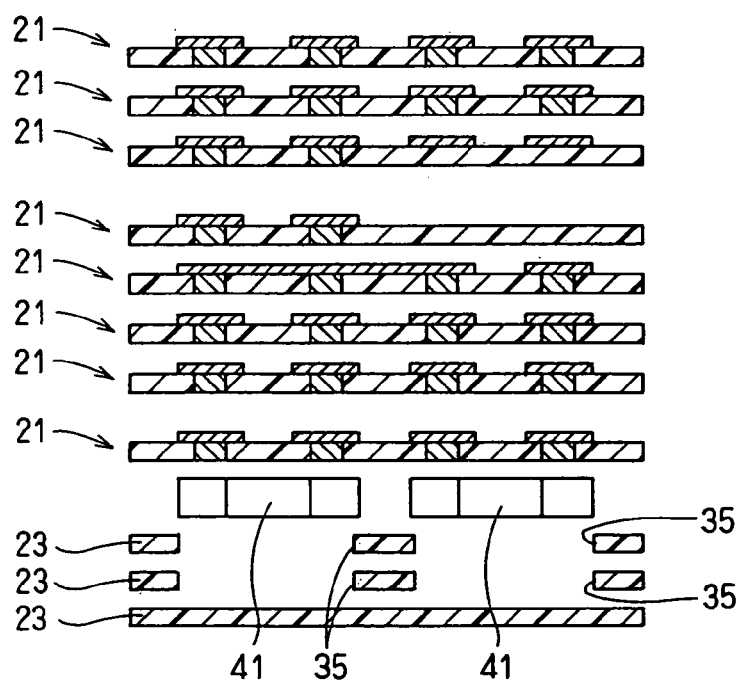
FIG. 8 is a cross-sectional view showing other variation of stacking configuration for the first and second embodiments.
Figure 9:
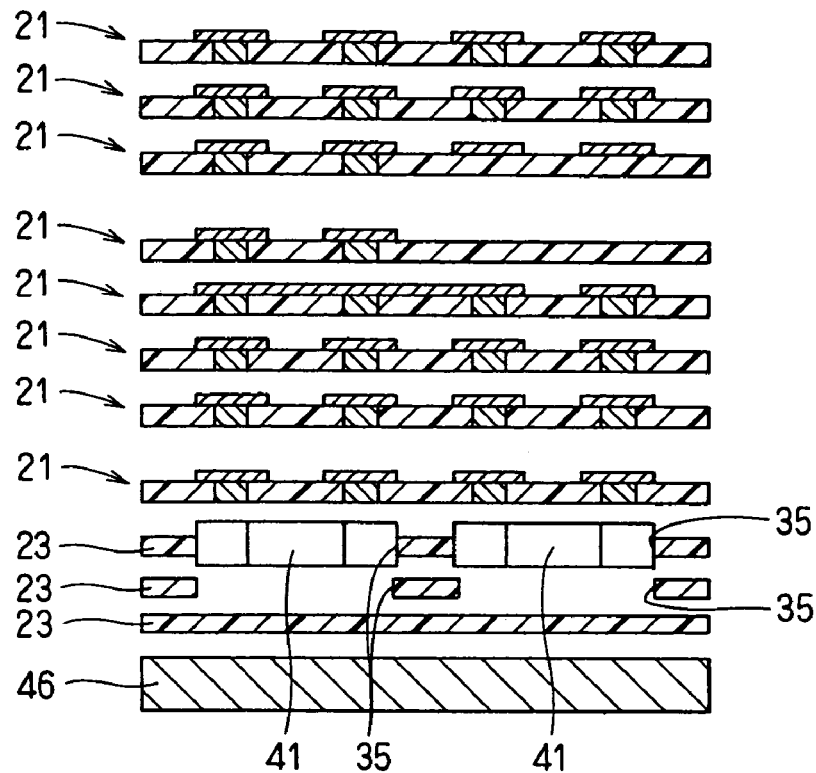
FIG. 9 is a cross-sectional view showing other variation of stacking configuration for the first and second embodiments.
Figure 10:
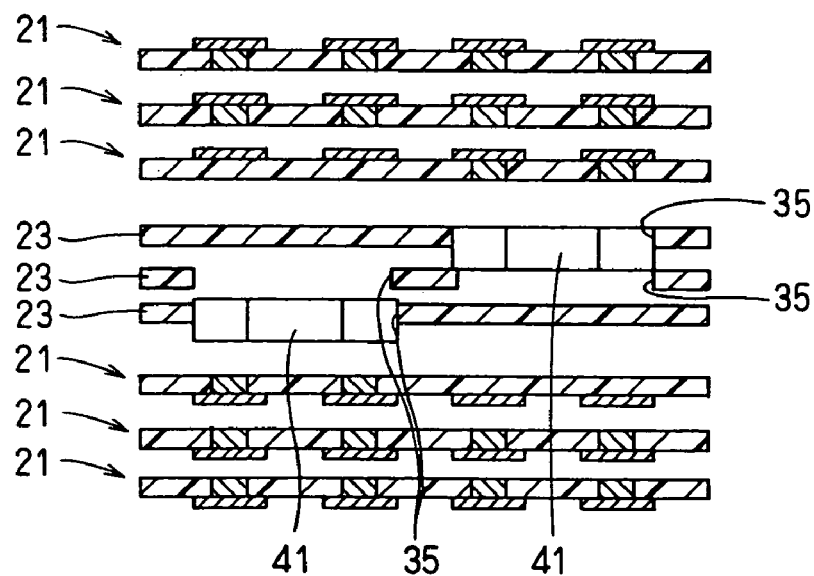
FIG. 10 is a cross-sectional view showing other variation of stacking configuration for the first and second embodiments.

In the first and second embodiments, neither stacking configurations nor the number of the single-sided conductive layer films 21, 31 are limited to the ones shown in FIGS. 1E and 5. The single-sided conductive layer films 21, 31, double-sided conductive layer films, and resin films having no conductive layers 22 may be combined and stacked on a case-by-case basis. For example, the stacking configurations shown in FIGS. 6 to 10, in which the single-sided conductive layer films 21, 31 and the resin films 23 having no conductive layers are combined and stacked, may be used. As shown in FIGS. 8 to 10, especially in the case that the opening 35 is formed only in the resin films 23 having no conductive layers, there is an advantage that the flexibility in circuit design in the board is improved. Nevertheless, the manufacturing process can be simplified if only the single-sided conductive layer films 21, 31 are stacked as in FIG. 1E and FIG. 5.

In the second embodiment, as shown in FIG. 4, the conductive layers 22 of the single-sided conductive layer film 21 and the electrodes 42 of the electric device 41 are connected by the conductive compounds 51, which are formed by sintering the conductive paste 50 packed in the via-holes 24. However, it is possible to connect without the conductive compounds 51 in the via-holes 24. For example, a connection shown in FIG. 11 may be used. To achieve the connection, a pair of electrodes 42a is formed on the lower surface of an electric device 43 as viewed in FIG. 11. Gold bumps are formed on each surface of the electrodes 42a. Then after nickel/gold plating layers 22b are formed on the surfaces of lands 22a, the electrodes 42a and the lands 22a of the conductive layers 22 are bonded together by pressure bonding or ultrasonic bonding.

Figure 11:
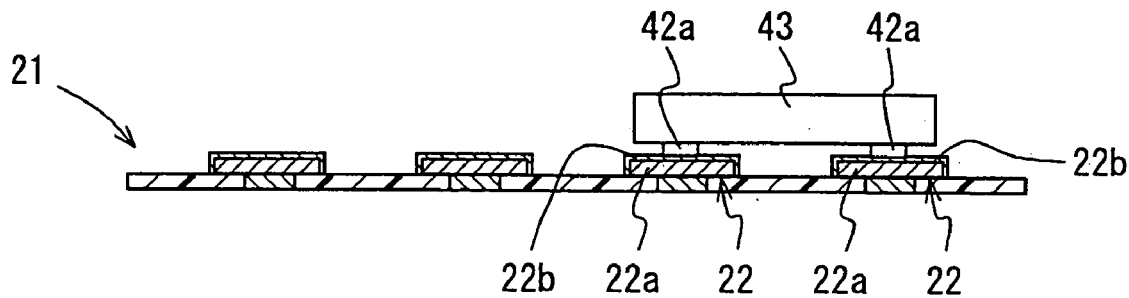
FIG. 11 is a cross-sectional view showing a variation of electrical connection method for the second embodiment.
Figure 12:
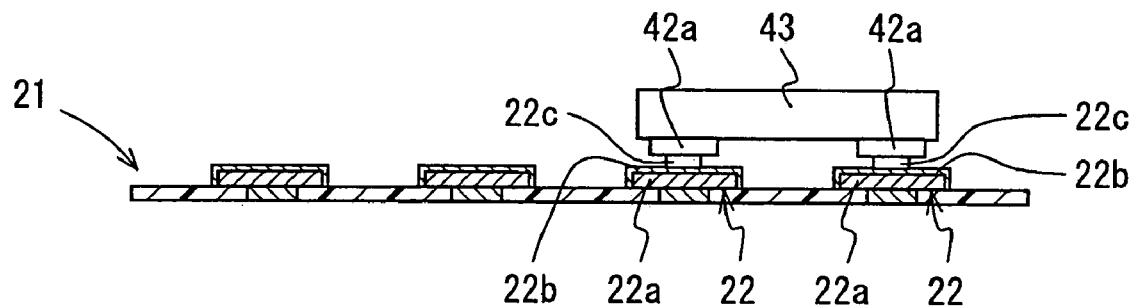
FIG. 12 is a cross-sectional view showing another variation of electrical connection method for the second embodiment.
Figure 13:
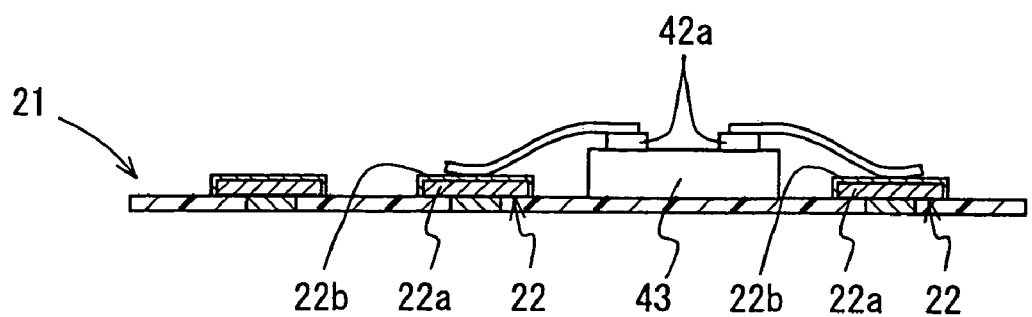
FIG. 13 is a cross-sectional view showing other variation of electrical connection method for the second embodiment.

Alternatively, another connection shown in FIG. 12 may also be used. To achieve the connection, a pair of electrodes 42a made of aluminum is formed on the lower surface of the electric device 43 as viewed in FIG. 12. After gold bumps 22c are formed on the nickel/gold plating layers 22b, the electrodes 42a and the lands 22a are bonded by pressure bonding or ultrasonic bonding. Alternatively, other connection shown in FIG. 13 may also be used. To achieve the connection, a pair of electrodes 42a made of aluminum is formed on the upper surface of the electric device 43 as viewed in FIG. 13. After the nickel/gold plating layers 22b are formed on the surfaces of the lands 22a of the conductive layers 22, each electrode 42a and each land 22a are electrically connected by wire bonding. In FIGS. 11 to 13, the electrodes 42a are formed on a horizontal surface of the electric device 43 as viewed in FIGS. 11 to 13. However, the electrodes 42a may be formed in other directions as long as the electrical connection between the electrodes 42a and the conductive layers 22 is possible.

In the third embodiment, neither stacking configurations nor the number of the single-sided conductive layer films 21 and the sheet member 81 are limited to the one shown in FIG. 14E. The single-sided conductive layer films 21, the sheet member 81, double-sided conductive layer films, and resin films having no conductive layers may be combined and stacked on a case-by-case basis. Nevertheless, the manufacturing process can be simplified if only the single-sided conductive layer films 21 and the sheet member 81 are stacked as in FIG. 14E.

Figure 15:
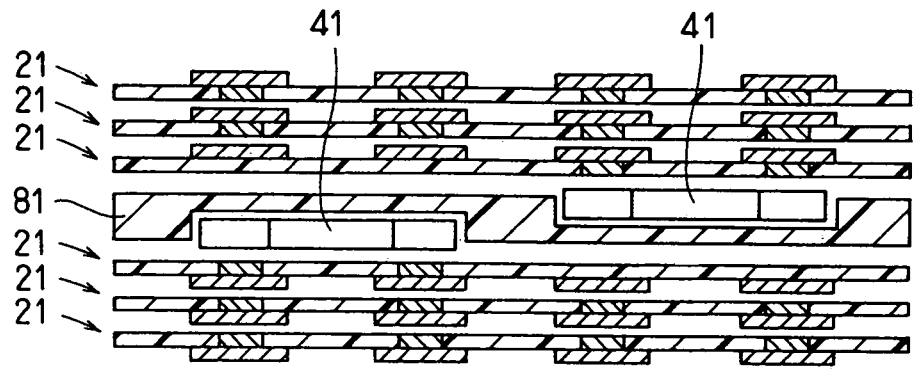
FIG. 15 is a cross-sectional view showing a variation of stacking configuration for the third embodiment.
Figure 16:
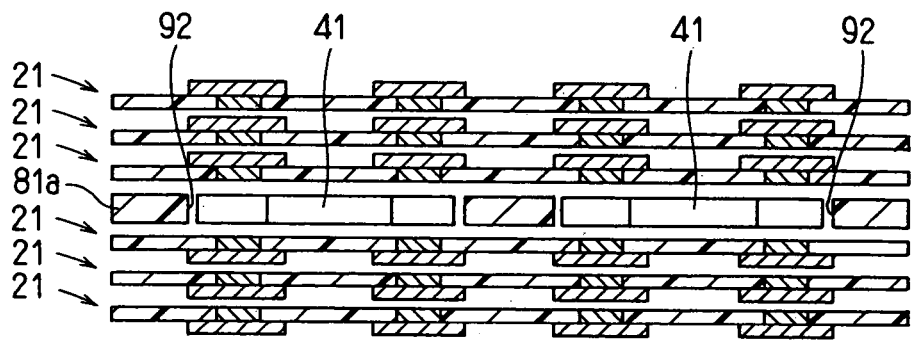
FIG. 16 is a cross-sectional view showing another variation of stacking configuration for the third embodiment.
Figure 17:
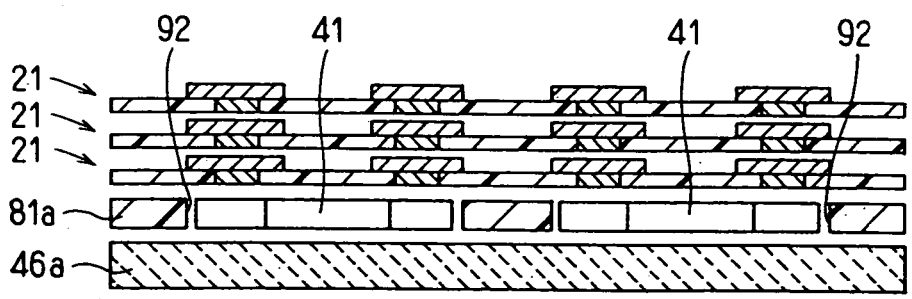
FIG. 17 is a cross-sectional view showing other variation of stacking configuration for the third embodiment.

In FIG. 14E, the sheet member 81 is piled on a lower surface of the stacked body of the stacked single-sided conductive layer films 21. However, as shown in FIG. 15, the sheet member 81 may be piled between the single-sided conductive layer films 21. In FIGS. 14D and 14E, the sheet member 81 has the recesses 82, in which the electric device 41 is inserted. Instead, as shown in FIG. 16, a sheet member 81a having openings 92 may be used. As shown in FIG. 17, a heat sink 46a, which is a heat releasing member made of an insulator such as ceramic, may be piled with the single-sided conductive layer films 21 and the sheet member 81a.

In the above embodiments and modifications, the resin films 23 and the sheet member 81 are made of a mixture of 65–35 weight % polyetheretherketone resin and 35–65 weight % polyetherimide resin. However, the resin films 23 and the sheet member 81 may be formed by adding non-conductive filler to polyetheretherketone resin and polyetherimide resin, or may be only made of polyetheretherketone (PEEK) or polyetherimide (PEI). In addition, thermoplastic resins such as polyphenylene sulfide (PPS), thermoplastic polyimide, or what is called liquid crystal polymer may be used as well. Resin films, which have a modulus of elasticity of 1–1000 MPa at the heating temperature when being pressed and heated and thermal resistance needed at a later soldering step, are preferably used.

In the third embodiment, different types of thermoplastic resins may be used for the resin films 23 and the sheet member 81, respectively. However, using a common material is advantageous when adhesion between and recycling of the resin films 23 and the sheet member 81 are taken into consideration.

In the above embodiments and modifications, the surface of the electric device 41 may be processed for improving the adhesion with the resin films 23, or may be coated with an adhesive.

In the above embodiments and modifications, the heat sink 46 is formed entirely on one surface of the printed wiring board 100. However, the heat sink 46 may be formed partially on the surface or may be formed on both surfaces. As a matter of course, unless the improvement in heat release is required, the printed wiring board 100 does not need the heat sink 46. A so-called bonding sheet such as a polyetherimide sheet, a thermosetting resin sheet containing heat conductive filler, or a thermoplastic resin sheet containing heat conductive filler may be adhered to a surface of the heat sink 46, at which the heat sink 46 is connected to the insulating base member 39, in order to improve adhesion or heat conductivity.

What is claimed is:

1. A method for manufacturing a printed wiring board, the method compnsing:
    preparing a plurality of conductive layer films, each of which includes a resin film made of thermoplastic resin, a conductive layer formed on one side of the resin film, a bottomed via-hole which is bottomed by the conductive layer, and a conductive paste packed in the bottomed via-hole;

preparing a sheet member in which a recess or an opening is formed, the sheet member beinig made of the same thermoplastic resin to the resin film, wherein no conductive layer and no bottomed via-hole is formed in the sheet member:

stacking the plurality of conductive layer films; placing the sheet member on an outer surface of or in a stacked body of the conductive layer films, wherein the stacked body is formed at the step of stacking;

inserting an electric device in the recess or the opening formed in the sheet member; and bonding the conductive layer films and the sheet member by pressing and heating the conductive layer films and the sheet member after the step of inserting.

2. The method in claim 1, wherein the recess or the opening has substantially the same size as the electric device, which is to be inserted into the opening.

3. The method in claim 2, wherein a depth of the recess or the opening is substantially equal to or smaller than a thickness of the electric device, which is to be inserted into the opening.

4. The method in claim 1,
wherein an electrode is formed on a surface of the electric device in a direction of stacking the conductive layer films and the sheet member, and wherein the bottomed via hole is formed in one of the conductive layer films at a position corresponding to the electrodes, and wherein the electrode and the conductive layer are electrically connected by the conductive paste in the step of bonding.

5. The method in claim 1, wherein the conductive layer films and the sheet member are heated at a temperature, at which the elastic modulus of the conductive layer films and the sheet member is 1–1000 MPa, in the step of bonding.

6. The method in claim 1, wherein the method includes a step of forming a heat releasing member on an outer surface of the stacked body of the conductive layer films and the sheet member after the step of inserting.

7. The method in claim 1, wherein the conductive layer films, the sheet member, and the heat releasing member are bonded together in tbe step of bonding.

* * * * *